US009009004B2

(12) United States Patent
Peh et al.

(10) Patent No.: US 9,009,004 B2
(45) Date of Patent: Apr. 14, 2015

(54) GENERATING INTERCONNECT FABRIC REQUIREMENTS

(75) Inventors: Li-Shiuan Peh, Princeton, NJ (US); Michael Justin O'Sullivan, Auckland (NZ); John Wilkes, Palo Alto, CA (US); Julie Ann Ward, Menlo Park, CA (US)

(73) Assignee: Hewlett-Packasrd Development Comany, L.P., Houston, TX (US)

( * ) Notice: Subject to any disclaimer, the term of this patent is extended or adjusted under 35 U.S.C. 154(b) by 3707 days.

(21) Appl. No.: 10/066,051

(22) Filed: Jan. 31, 2002

(65) Prior Publication Data
US 2003/0144822 A1    Jul. 31, 2003

(51) Int. Cl.
*G06F 17/50*    (2006.01)
*H04L 12/24*    (2006.01)

(52) U.S. Cl.
CPC .......... *H04L 41/0896* (2013.01); *G06F 17/509* (2013.01); *H04L 41/145* (2013.01)

(58) Field of Classification Search
USPC ........................................................... 703/1
See application file for complete search history.

(56) References Cited

U.S. PATENT DOCUMENTS

| 4,920,487 | A | 4/1990 | Baffes |
| 5,107,489 | A | 4/1992 | Brown et al. |
| 5,113,496 | A | 5/1992 | McCalley et al. |
| 5,138,657 | A | 8/1992 | Colton et al. |
| 5,245,609 | A | 9/1993 | Ofek et al. |
| 5,307,449 | A | 4/1994 | Keiley et al. |
| 5,329,619 | A | 7/1994 | Pagé et al. |
| 5,426,674 | A * | 6/1995 | Nemirovsky et al. ......... 709/241 |
| 5,524,212 | A | 6/1996 | Somani et al. |
| 5,581,689 | A | 12/1996 | Slominski et al. |
| 5,598,532 | A | 1/1997 | Liron |
| 5,634,004 | A | 5/1997 | Gopinath et al. |
| 5,634,011 | A | 5/1997 | Auerbach et al. |
| 5,649,105 | A | 7/1997 | Aldred et al. |
| 5,651,005 | A | 7/1997 | Kwok et al. |

(Continued)

FOREIGN PATENT DOCUMENTS

WO    WO-96/17458 A    6/1996

OTHER PUBLICATIONS

Zbigniew Dziong, Marek Juda, Lorne Mason; A Framework for Bandwidth Management in ATM Networks—Aggregate Equivalent Bandwidth Estimation Approach; IEEE?ACM Transactions on Networking, 1997; IEEE Press; vol. 5 Issue 1 pp. 134-147.*

(Continued)

*Primary Examiner* — Omar Fernandez Rivas
*Assistant Examiner* — Iftekhar Khan
(74) *Attorney, Agent, or Firm* — Westberg Law Office

(57) ABSTRACT

A technique for generating interconnect fabric requirements. The technique programmatically generates an interconnect design problem based on criteria specified by a user. In one aspect, a computer implemented method is provided for generating an interconnect fabric design problem. The problem includes requirements for a plurality of flows among a set of network nodes. A source node and a terminal node are selected, from among the set of network nodes, for a flow to be added to the requirements. A maximum capacity available at the selected source node and the selected terminal node is determined. The flow is generated having a capacity less than or equal to the lower of the maximum capacity of the source node and the terminal node. Depending upon the input criteria, the invention may generate problems with greater flexibility than prior techniques.

27 Claims, 10 Drawing Sheets

(56) References Cited

U.S. PATENT DOCUMENTS

| | | | |
|---|---|---|---|
| 5,793,362 | A | 8/1998 | Matthews et al. |
| 5,805,578 | A | 9/1998 | Stirpe et al. |
| 5,815,402 | A | 9/1998 | Taylor et al. |
| 5,831,996 | A | 11/1998 | Abramovici et al. |
| 5,835,498 | A | 11/1998 | Kim et al. |
| 5,838,919 | A | 11/1998 | Schwaller et al. |
| 5,857,180 | A | 1/1999 | Hallmark et al. |
| 5,878,232 | A | 3/1999 | Marimuthu |
| 5,970,232 | A | 10/1999 | Passint et al. |
| 5,987,517 | A | 11/1999 | Firth et al. |
| 6,003,037 | A | 12/1999 | Kassabgi et al. |
| 6,031,984 | A | 2/2000 | Walser |
| 6,038,219 | A | 3/2000 | Mawhinney et al. |
| 6,047,199 | A | 4/2000 | DeMarco |
| 6,052,360 | A | 4/2000 | Rogers |
| 6,108,782 | A | 8/2000 | Fletcher et al. |
| 6,141,355 | A | 10/2000 | Palmer et al. |
| 6,148,000 | A | 11/2000 | Feldman et al. |
| 6,157,645 | A | 12/2000 | Shobatake |
| 6,195,355 | B1 | 2/2001 | Demizu |
| 6,209,033 | B1 * | 3/2001 | Datta et al. .................. 709/224 |
| 6,212,568 | B1 | 4/2001 | Miller et al. |
| 6,253,339 | B1 | 6/2001 | Tse et al. |
| 6,331,905 | B1 | 12/2001 | Ellinas et al. |
| 6,345,048 | B1 | 2/2002 | Allen et al. |
| 6,363,334 | B1 | 3/2002 | Andrews et al. |
| 6,418,481 | B1 | 7/2002 | Mancusi et al. |
| 6,442,584 | B1 | 8/2002 | Kolli et al. |
| 6,452,924 | B1 | 9/2002 | Golden et al. |
| 6,526,420 | B2 | 2/2003 | Borowsky et al. |
| 6,539,027 | B1 | 3/2003 | Cambron |
| 6,539,531 | B2 | 3/2003 | Miller et al. |
| 6,557,169 | B1 | 4/2003 | Erpeldinger |
| 6,570,850 | B1 | 5/2003 | Gutierrez et al. |
| 6,594,701 | B1 | 7/2003 | Forin |
| 6,598,080 | B1 | 7/2003 | Nagami et al. |
| 6,603,769 | B1 | 8/2003 | Thubert et al. |
| 6,611,872 | B1 | 8/2003 | McCanne |
| 6,614,796 | B1 | 9/2003 | Black et al. |
| 6,625,777 | B1 | 9/2003 | Levin et al. |
| 6,628,649 | B1 | 9/2003 | Raj et al. |
| 6,633,909 | B1 | 10/2003 | Barrett et al. |
| 6,650,639 | B2 | 11/2003 | Doherty et al. |
| 6,668,308 | B2 | 12/2003 | Barroso et al. |
| 6,675,328 | B1 | 1/2004 | Krishnarnachari et al. |
| 6,687,222 | B1 | 2/2004 | Albert et al. |
| 6,694,361 | B1 | 2/2004 | Shah et al. |
| 6,697,334 | B1 | 2/2004 | Klincewicz et al. |
| 6,697,369 | B1 | 2/2004 | Dziong et al. |
| 6,697,854 | B1 | 2/2004 | Glassen et al. |
| 6,701,327 | B1 | 3/2004 | Jones et al. |
| 6,724,757 | B1 | 4/2004 | Zadikian et al. |
| 6,744,767 | B1 | 6/2004 | Chiu et al. |
| 6,757,731 | B1 | 6/2004 | Barnes et al. |
| 6,766,381 | B1 | 7/2004 | Barker et al. |
| 6,778,496 | B1 | 8/2004 | Meempat et al. |
| 6,804,245 | B2 | 10/2004 | Mitchem et al. |
| 6,857,027 | B1 | 2/2005 | Lindeborg et al. |
| 2002/0083159 | A1 | 6/2002 | Ward et al. |
| 2002/0091804 | A1 | 7/2002 | Ward et al. |
| 2002/0091845 | A1 | 7/2002 | Ward et al. |
| 2002/0120770 | A1 | 8/2002 | Fukami et al. |
| 2002/0156828 | A1 | 10/2002 | Ishizaki et al. |
| 2002/0188732 | A1 | 12/2002 | Buckman et al. |
| 2003/0065758 | A1 | 4/2003 | O'Sullivan et al. |
| 2003/0145294 | A1 | 7/2003 | Ward et al. |
| 2005/0021583 | A1 | 1/2005 | Andrzejak et al. |
| 2005/0021831 | A1 | 1/2005 | Andrzejak et al. |
| 2005/0033844 | A1 | 2/2005 | Andrzejak et al. |

OTHER PUBLICATIONS

Shahoumian et al. "Storage Area Network Fabric Design". Nov. 8, 2000. pp. 1-8.*

Anil Kamath et al. "Routing and Admission Control in General Topology Network with Poisson Arrivals". Society for Industrial and Applied Mathematics, 1996. pp. 269-278.*

Julie Ward Drew et al., U.S. Appl. No. 10/290,760, filed Nov. 8, 2002.

Julie Ward Drew, U.S. Appl. No. 10/290,643, filed Nov. 8, 2002.

Julie Ward Drew et al., U.S. Appl. No. 10/845,855, filed May 13, 2004.

Mathew Andrews et al., Integrated Scheduling of Unicast and Multicast Traffic in an Input-Queued Switch, 1999. <http://cm.bell-labs.com/cm/ms/who/andrews/infocom99switch.ps>.

Viraphol Chaiyakul, Assignment Decision Diagram for High-Level Synthesis, 1992.

Andre Dehon, Notes on Coupling Processors with Reconfigurable Logic, MIT Transit Project, Transit Note #118, 1995.

Cathy Fulton et al., Impact Analysis of Packet-Level Scheduling on an ATM Shared-Memory Switch, Infocom, vol. 3 pp. 947-954, 1998, IEEE, New York, NY.

Hiroshi Inose, An Introduction to Digital Integrated Communication Systems, pp. 87-89, 1979, Peter Peregrinus Ltd., Stevenage, United Kingdom.

A. Richard Newton, Interface-Based Design; Introduction, University of California at Berkeley, Apr. 1999.

Derek C. W. Pao, A Congestion Control Algorithm for Multipoint-to-Multipoint ABR Service in ATM Network, Proceedings of the IEEE Conference on High Performance Switching and Routing, pp. 167-175, Jun. 26, 2000, IEEE Press, New York, NY.

Rainer Schoenen et al., Weighted Arbitration Algorithms with Priorities for Input-Queued Switches with 100% Thoughput, 1999, <http://www.iss.rwth-aachen.de/Projekte/Theo/papers/Schoenen99bssw.ps.gz>.

Oryal Tanir et al., Structural Reuse in the Design of ATM Switch Fabrics, 1997.

I. Widjaja et al., Performance Issues in VC-Merge Capable ATM LSRs, RFC 2682, Sep. 1999, The Internet Society, Reston, VA.

Julie Ward, U.S. Appl. No. 09/707,227, filed Nov. 6, 2000.

Julie Ward et al., Storage Area Network (SAN) Fabric Design, PowerPoint presentation given at Berkeley, IEOR Department Seminar, Berkeley CA, Oct. 8, 2001.

Julie Ward et al., Storage Area Network (SAN) Fabric Design, PowerPoint presentation given at the INFORMS International Conference, Maui HI, Jun. 19, 2001.

Julie Ward et al., Appia: Automatic Storage Area Network Fabric Design, Conference on File and Storage Technologies (FAST'02), pp. 203-217, Jan. 28, 2002, Usenix, Berkeley, CA.

Staffan Bo Strand, Storage Area Networks and SANTK, Thesis, Dec. 2001, University of Minnesota, Minneapolis, MN.

Matthew T. O'Keefe et al., Designing Fibre Channel Storage Area Networks, Feb. 2001. <http://www.borg.umn.edu/fc/papers/SANTK.pdf>.

Robert E. Bixby, Solving Real-World Linear Programs: A Decade and More of Progress, Jan. 2002.

Ravindra K. Ahuja et al., Network Flows: Theory, Algorithms, and Applications, pp. 4-9, 649-686, 1993, Prentice-Hall, Upper Saddle River, NJ.

Christodoulos A. Floudas et al., Quadratic Optimization, 1995.

Parameswaran Ramanathan et al., Resource Placement with Multiple Adjacency Constraints in k-ary n-Cubes, 1995.

Staffan Strand, Automatic Generation of Core/Edge Topology SANs Using SANTK, May 23, 2002.

Joachim P. Walser, Solving Linear Pseudo-Boolean Constraint Problems with Local Search, 1997, American Association for Artificial Intelligence, Menlo Park, CA.

Julie Ward et al., Storage Area Network Fabric Design, PowerPoint presentation given at the Math Sciences Research Institute for Combinatorial Design, Berkeley CA, Nov. 8, 2000.

Klingman, et al. "NETGEN: A program for generating largescale capacitated assignment, transporation, and minimum cost flow network problems," Mangement Science, p. 814-821(1974).

Bertsekas, Dimitri P. "Linear Network Optimization," The MIT Press, Cambridge/London, 1991, Appendix A.1.1, pp. 253-260.

* cited by examiner

GENERATING INTERCONNECT FABRIC REQUIREMENTS

FIELD OF THE INVENTION

The present invention relates to the field of networks. More particularly, this invention relates to network design problems.

BACKGROUND OF THE INVENTION

An interconnect fabric provides for communication among a set of nodes in a network. Communications originate within the network at a source node and terminate at a terminal node. Thus, a wide variety of networks may be viewed as a set of source nodes that communicate with a set of terminal nodes via an interconnect fabric. For example, a storage area network may be arranged as a set of computers as source nodes which are connected to a set of storage devices as terminal nodes via an interconnect fabric that includes communication links and devices such as hubs, routers, switches, etc. Devices such as hubs, routers, switches, etc., are hereinafter referred to as interconnect devices. Depending on the circumstances, a node may assume the role of source node with respect to some communications and of terminal node for other communications.

The communication requirements of an interconnect fabric may be characterized in terms of a set of flow requirements. A typical set of flow requirements specifies the required communication bandwidth from each source node to each terminal node. The design of an interconnect fabric usually involves selecting the appropriate arrangement of physical communication links and interconnect devices and related components that will meet the flow requirements.

Techniques for designing interconnect fabrics are being developed and refined. In order to evaluate the effectiveness of an interconnect fabric design technique, it may be desirable to apply the technique to a variety of design problems, for example, various sets of flow requirements, for which a feasible solution exists. The generation of such fabric design problems presents a barrier to the evaluation of design techniques. This is because design problems have largely been generated by manually. Accordingly, such techniques can be time-consuming, tedious and error-prone.

Generation techniques have been developed. These include NETGEN, described by Klingman, et al. in "NETGEN: A program for generating large-scale capacitated assignment, transportation, and minimum cost flow network problems," Management Science, pp. 814-820 (1974) and GRIDGEN, described by Bertsekas in "Linear Network Optimization", The MIT Press, Cambridge/London, 1991, appendix A.1.1. These techniques, however, are limited in their ability to specify network problem characteristics.

Therefore, what is needed is an improved technique for generating interconnect fabric requirements. It is to these ends that the present invention is directed.

SUMMARY OF THE INVENTION

A technique is disclosed for generating interconnect fabric requirements. The technique programmatically generates an interconnect design problem based on criteria specified by a user. Depending upon the input criteria, the invention may generate problems with greater flexibility than prior techniques.

In one aspect, a computer implemented method is provided for generating an interconnect fabric design problem. The problem includes requirements for a plurality of flows among a set of network nodes. A source node and a terminal node are selected from among the set of network nodes for a flow to be added to the requirements. A maximum capacity available at the selected source node and the selected terminal node is determined. The flow is generated having a capacity less than or equal to the lower of the maximum capacity of the source node and the terminal node.

In another aspect of the invention, a system is provided for generating an interconnect fabric design problem for communication between a set of nodes. A set of design information includes user-specified parameters for the design problem. In response to the design information, a fabric design problem generation tool generates a design for the interconnect fabric, including a set of flow requirements among the set of nodes. To add a flow to the flow requirements, a source node and a terminal node for a flow to be added may be selected from among the set of network nodes. A maximum capacity available at the selected source node and the selected terminal node may be determined. The flow may be generated having a capacity less than or equal to the lower of the maximum capacity of the source node and the terminal node.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT

Figure 1:
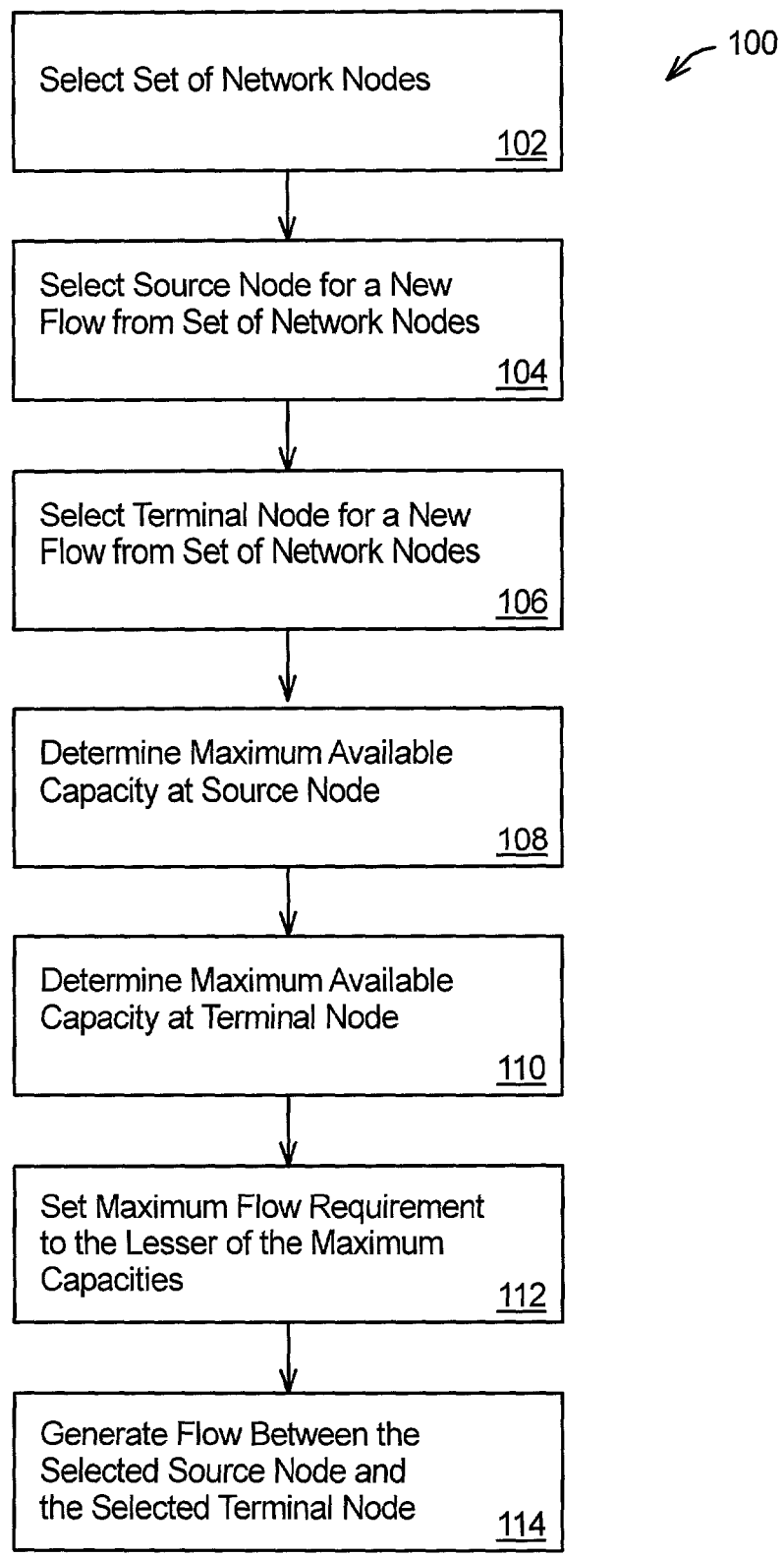
FIG. 1 shows a method of generating an interconnect fabric design problem according to an aspect of the present invention.

FIG. 1 shows a method 100 of generating an interconnect fabric design problem according to an aspect of the present invention. The design problem may specify nodes that are to be interconnected by the design and requirements for communication flows among the specified nodes. These requirements may be referred to as flow requirements and may include, for example, source and terminal nodes for communication flows and required communication bandwidth for the flows. The method 100 is performed generally by selecting a set of nodes and then adding flows to the requirements.

Figure 2:
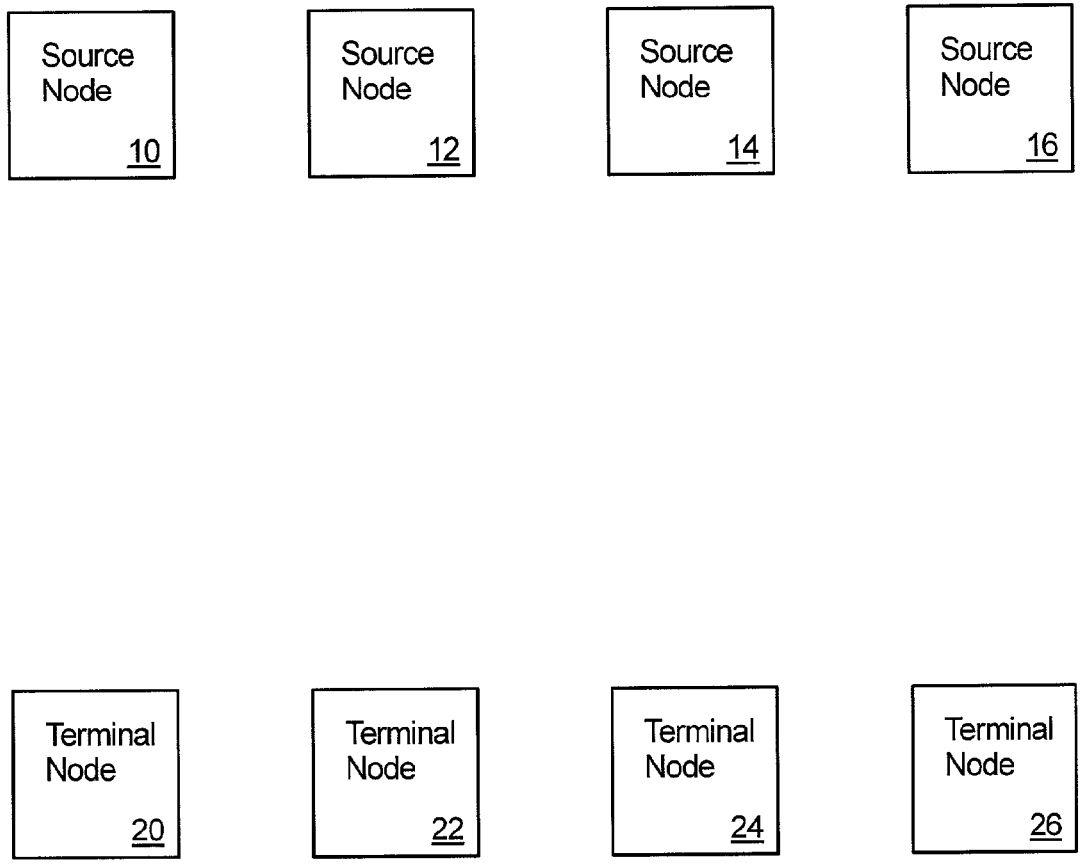
FIG. 2 shows an exemplary set of network nodes for a design problem.

At step 102, a set of network nodes that are to be interconnected by the interconnect fabric design problem may be determined. The set of network nodes may, for example, be provided as a user-selected input to the method. FIG. 2 shows an exemplary set of network nodes, including four source nodes (source nodes 10-16 in the figures below) and four terminal nodes (terminal nodes 20-26 in the figures below) for an interconnect design problem. Source nodes generally originate communications, whereas, terminal nodes are generally recipients of communications. Depending on the circumstances, however, a node may assume the role of source node with respect to some communications and of terminal node for other communications.

In one embodiment, the source nodes 10-16 are host computers and terminal nodes 20-26 are storage devices. Thus, the interconnect fabric design problem may be for storage area network.

In step 104, a source node for a new flow to be added to the flow requirements may be selected. For example, the source node may be randomly selected from among the set of source nodes 10-16. Alternately, the source node may be selected from the set according to a predetermined sequence. In some embodiments, the set of nodes may include only one possible source node. In which case, that node is selected in the step 104. It will be apparent that other techniques for selecting a source node from among the set of nodes may be utilized in the step 104. In the example of FIG. 2, the source node 10 may be selected in step 104.

In step 106, a terminal node for the new flow to be added to the flow requirements may be selected. As in selection of the source node in step 104, selection of the terminal node in step 106 may be performed randomly, according to a sequence, or in accordance with another selection technique. In the example of FIG. 2, the terminal node 24 may be selected in step 106.

In a preferred embodiment, the flow requirements for the design problem do not exceed the capacities of the source and terminal nodes. For example, each source and terminal node may have a specified maximum bandwidth capacity. Further, each source and terminal node may have capacity for a maximum number of ports, each of which has a maximum bandwidth capacity. If the design problem specifies flow requirements that exceed a capacity of a source or terminal node, it becomes infeasible for an interconnect fabric to be designed that will meet such flow requirements without also modifying the source and terminal nodes or allowing flows to be split across multiple ports. For some network design problems, splitting of flows across multiple ports may be desired, particularly to test design techniques that can accommodate such flows.

The present invention preferably avoids adding infeasible flows to the flow requirements by examining available capacities, taking into account existing flow requirements in the design problem and adding flows to the design problem that can be accommodated by the available capacities. Thus, in step 108, a maximum available capacity at the source node selected in the step 102 may be determined.

Since the source node 10 was selected the example of FIG. 2, its maximum capacity may be determined in step 108. Assume that the source node 10 has two ports, each having a maximum bandwidth capacity of 100 megabits per second (Mb/s). Thus, assuming there are no existing flows for the source node 10 in the design problem, the maximum bandwidth is 100 Mb/s. This also assumes flows are not split across the ports. If splitting is allowed, the maximum capacity would be 200 Mb/s.

In step 110, a maximum available capacity at the terminal node selected in the step 104 may be determined. Since the terminal node 24 was selected in the example, its maximum capacity may be determined in step 110. Assume that the terminal node 24 has three ports, each having a maximum bandwidth capacity of 100 Mb/s. Thus, assuming there are no existing flows for the terminal node 24 in the design problem, the maximum bandwidth capacity is also 100 Mb/s (or 300 Mb/s if splitting of flows is permitted).

In step 112, a maximum feasible bandwidth for the flow to be added between the selected source node and the terminal node may be set to the lower of the maximum capacities determined in the steps 108 and 110. This is to avoid adding a flow that may exceed the maximum available capacity of either the source node or the terminal node. In the example of FIG. 2, the maximum available capacity for the source node 10 is 100 Mb/s and the maximum available capacity for the terminal node 24 is 100 Mb/s. Thus, the lower of the two capacities is also 100 Mb/s.

In step 114, the flow may be generated between the selected source and terminal nodes. The bandwidth requirement for the flow may be selected to be a value that is less than or equal to the maximum feasible value for flow, as determined in step 112. For example, the bandwidth requirement may be randomly selected to be a value between 1 Mb/s and the maximum value. In addition, if there is more than one port at either the source node or the terminal node that may accommodate the flow, then the flow may be assigned to one of those ports either randomly or in accordance with a specified order. If splitting of flows is permitted, portions of the flow are assigned to ports while avoiding exceeding capacities of the ports.

Figure 3:
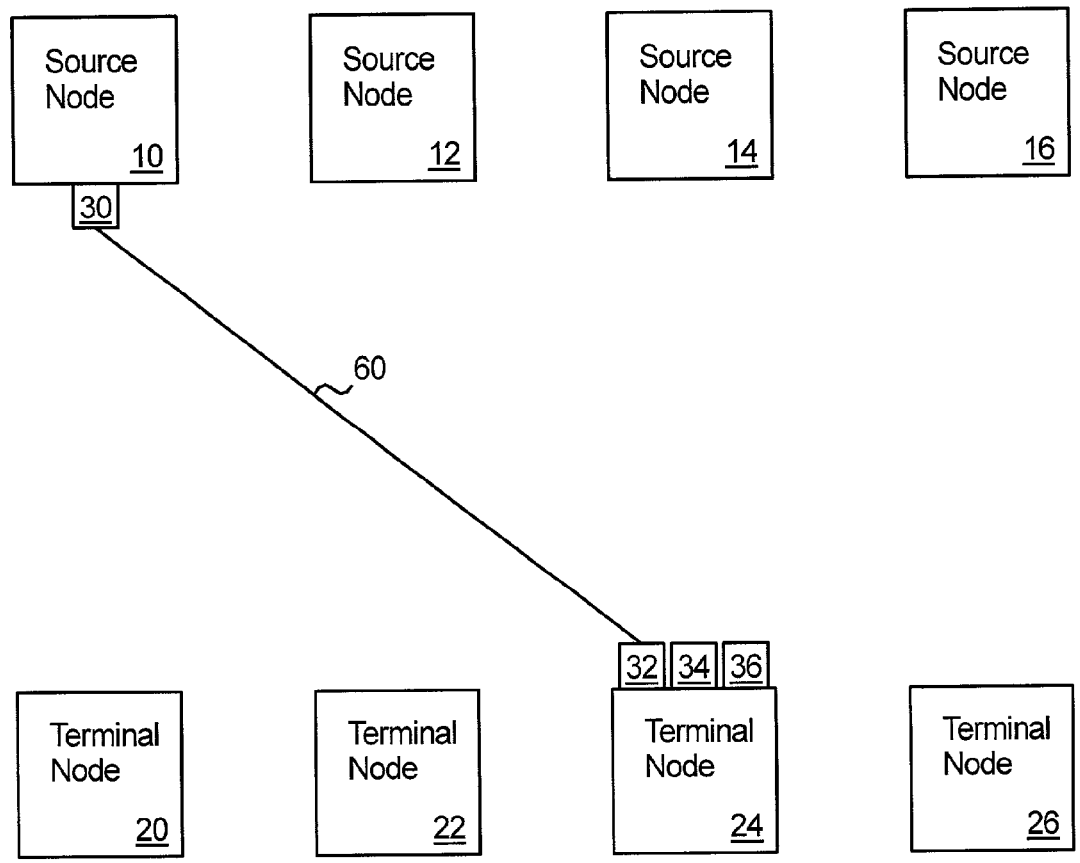
FIGS. 3-5 show the set of network nodes of FIG. 2 in stages of progress as flows are added to a set of flow requirements for the design problem.

In the example, the bandwidth requirement for the flow may be randomly selected in step 110 to be 10 Mb/s, which is less than the maximum value of 100 Mb/s. The requirements for this flow, including its source and terminal nodes, port assignments and its bandwidth may then be added to the flow requirements for the design problem. FIG. 3 illustrates the flow 60 after having been added to the flow requirements for the design problem. Because a port 30 at the source node 10 and each of three ports 34, 36 and 38 at the terminal node 24 have sufficient capacity to accommodate the flow 60, the flow 60 may be assigned the port 30 of the source node 10 and to a first port (i.e. the leftmost port in FIG. 3) of the terminal node 24. Particularly, the flow 60 may be assigned to port 32 of the terminal node 24.

Additional flows may be added to the flow requirements for the design problem by repeating the steps 104-114 of the method 100.

Figure 4:
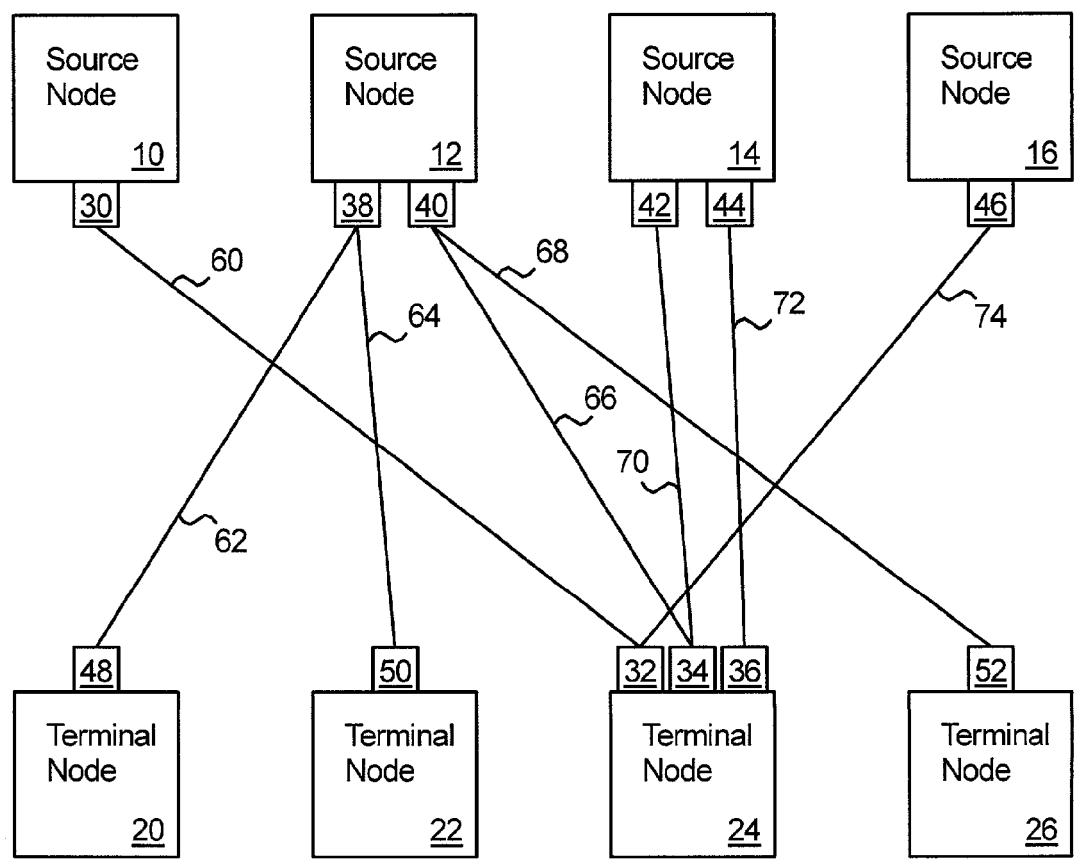

FIG. 4 illustrates the exemplary set of nodes from FIG. 1 after several passes of the method 100. These include: the flow 60 between port 30 of source node 10 and port 32 of terminal node 24; a flow 62 between port 38 of source node 12 and port 48 of terminal node 20; a flow 64 between port 38 of source node 12 and port 50 of terminal node 22; a flow 66 between port 40 of source node 12 and port 34 of terminal node 24; a flow 68 between port 40 of source node 12 and port 52 of terminal node 26; a flow 70 between port 42 of source node 14 and port 34 of terminal node 24; a flow 72 between port 44 of source node 14 and port 36 of terminal node 24; and a flow 74 between port 46 of source node 16 and port 32 of terminal node 24.

In a next pass through the method 100, the source node 12 may be selected in the step 104 and the terminal node 24 may be selected in the step 106. Thus, a new flow to be added to the flow requirements of FIG. 5 may be between the source node 12 and the terminal node 24.

Assume that each of the ports 38 and 40 of the node 12 has a maximum bandwidth capacity of 100 Mb/s; that flow 62 requires 40 Mb/s of capacity; and that each of the flows 64, 66 and 68 requires 20 Mb/s. Thus, the available capacity at port 38 may be determined to be 40 Mb/s (100 Mb/s minus 40 Mb/s for flow 62 and 20 Mb/s for flow 64) and the available capacity at port 40 may be determined to be 60 Mb/s (100 Mb/s minus 20 Mb/s for each of flows 66 and 68). Accordingly, the maximum available capacity at the source node 12 may be determined in step 108 to be 60 Mb/s (at port 40).

As before, assume that each of the ports 32, 34 and 36 of terminal node 24 has a maximum bandwidth capacity of 100 Mb/s. Assume also that flow 60 requires 10 Mb/s of capacity and flow 74 requires 30 Mb/s of capacity. Thus, the available capacity at port 32 may be determined to be 60 Mb/s (100 Mb/s minus 10 Mb/s for flow 60 and 30 Mb/s for flow 74). Assume also that flow 70 requires 10 Mb/s of capacity. Thus, the available capacity at port 34 may be determined to be 70 Mb/s (100 Mb/s minus 20 Mb/s for flow 66 and 10 Mb/s for flow 70). And, assume that flow 72 requires 80 Mb/s of capacity. Thus, the available capacity at port 36 may be determined to be 20 Mb/s. Accordingly, the maximum available capacity at the terminal node 24 may be determined in step 110 to be 70 Mb/s (at port 34).

In step 112, the maximum requirement for the flow to be added between the source node 12 and terminal node 24 may be set to lesser of these maximum values found in steps 108 and 110. In the example, the available capacity of 60 Mb/s at the port 40 is less than the available capacity of 70 Mb/s at the port 34. Accordingly, the maximum requirement may be set to 60 Mb/s in the step 112.

Figure 5:
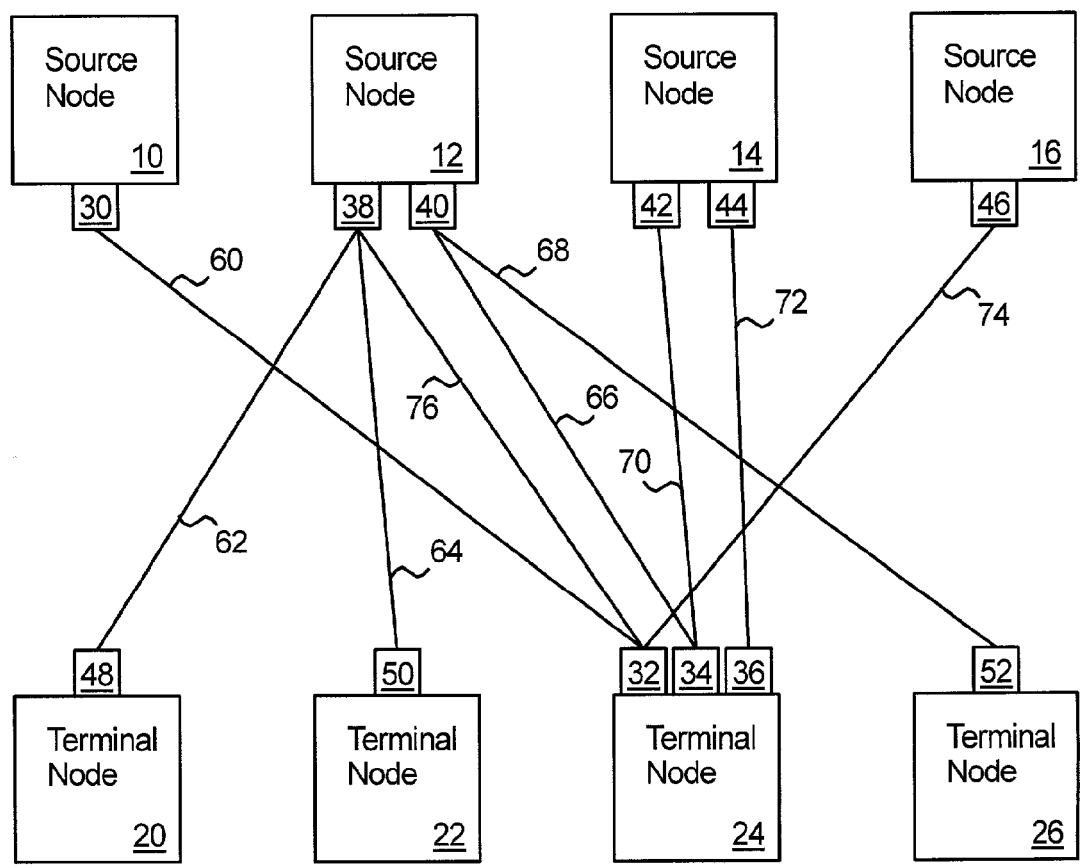

In step 114, the flow may be generated between the source node 12 and the terminal node 24. The bandwidth requirement for the flow may be selected to be a value that at least 1 Mb/s and less than or equal to the maximum feasible value for flow of 60 Mb/s, as determined in step 112. For example, the bandwidth requirement may be randomly selected to be 25 Mb/s. Because both ports 38 and 40 at the source node 12 may accommodate the flow, the flow may be assigned to the first port (i.e. the leftmost port), which in FIG. 4 is the port 38. Similarly, because ports 32 and 34 at the terminal node 24 may accommodate the flow, the flow may be assigned to the first or leftmost port, which in FIG. 4 is the port 32. FIG. 5 shows the newly added flow 76 between the port 38 and the port 32.

The method 100 of FIG. 1 may be repeated, adding flows to the interconnect fabric design problem until a stopping condition is reached. For example, the stopping condition may include each source and terminal node having a specified number of flows. As another example, the stopping condition may include a random aspect, such as reaching a minimum number of flows or level of bandwidth required for the nodes and then adding a random number of additional flows or bandwidth levels to the design problem. As yet another example, the stopping condition may be based on ratio of a sum of bandwidth requirements assigned to a node to a sum of bandwidth capacity at the node. This ratio may also be referred to as "port saturation."

Figure 6:
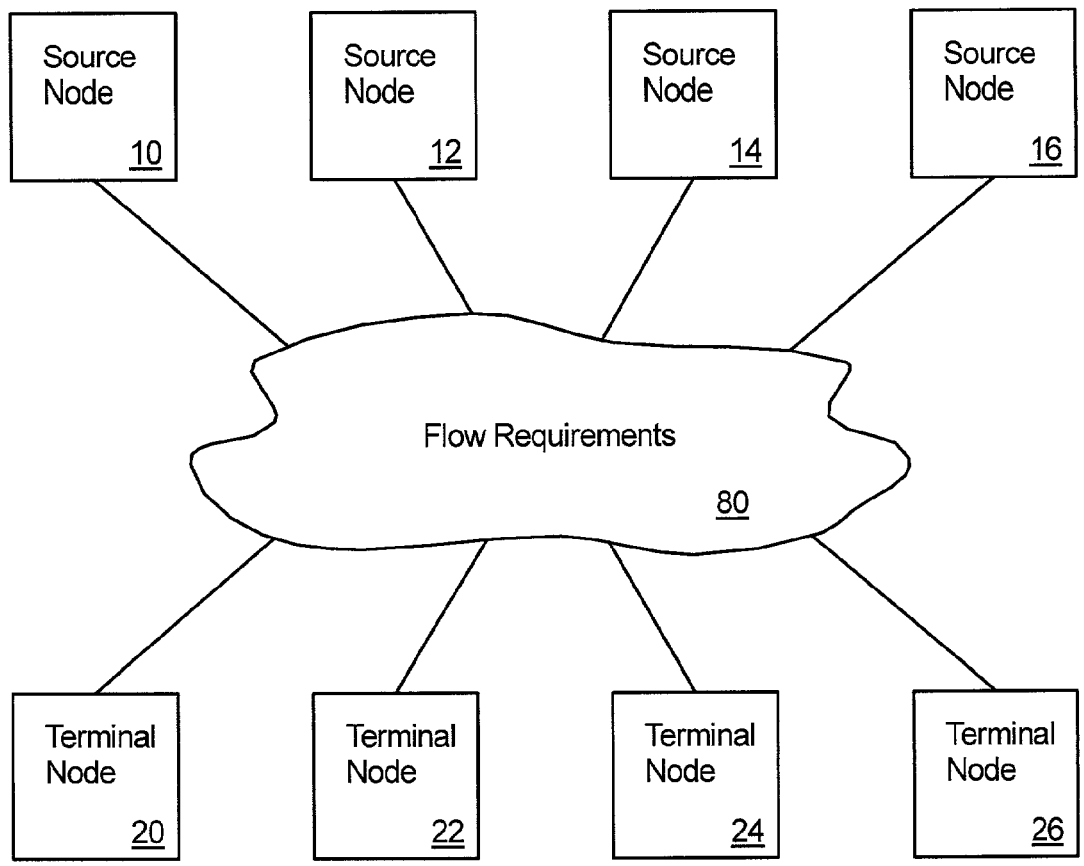
FIG. 6 shows an exemplary design problem that may be formed by the method of FIG. 1.

Once the stopping condition is reached, the design problem includes a set of flow requirements that corresponds to the set of nodes. FIG. 6 shows an exemplary design problem that includes a set of flow requirements 80 among the source nodes 10-16 and the terminal nodes 22-30.

Figure 7:
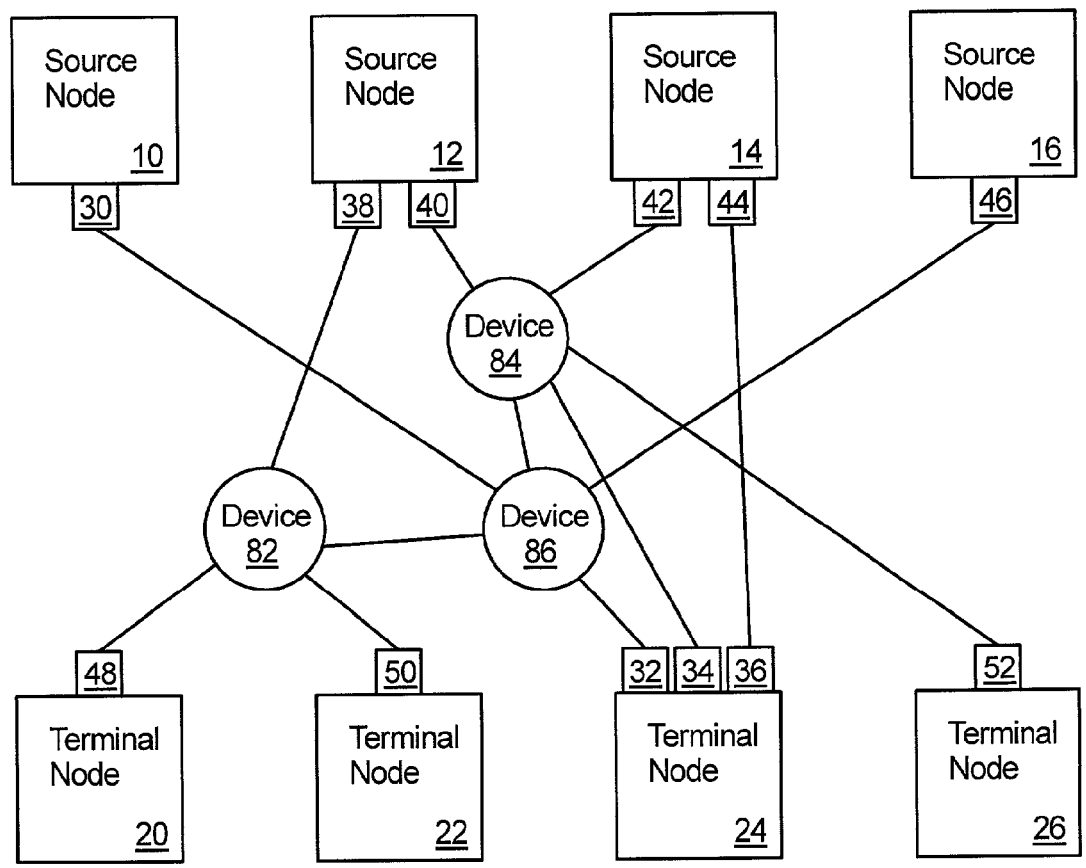
FIG. 7 shows an exemplary design solution for an interconnect fabric including switches and hubs.

Then, using the design problem formed by the method 100, a network designed technique may be applied to the problem. FIG. 7 illustrates an exemplary design in which interconnect devices 82, 84 and 86 may be used to carry the flow requirements 80 for the design problem. A design technique may be applied to any number of design problems formed by the present invention. Thus, in one aspect, the present invention facilitates evaluation of interconnect fabric design techniques that may be under development or otherwise in need of evaluation. Particular examples of design techniques are described in copending U.S. application Ser. No. 09/707,227, filed Nov. 16, 2000 and U.S. application Ser. No. 10/027,564, entitled, "Designing Interconnect Fabrics," and filed Dec. 19, 2001, and which is continuation-in-part of U.S. application Ser. No. 09/707,227, the contents of both of which are hereby incorporated by reference. It will be apparent, however, that other uses may be made of a design problem formed by the present invention.

Figure 8:
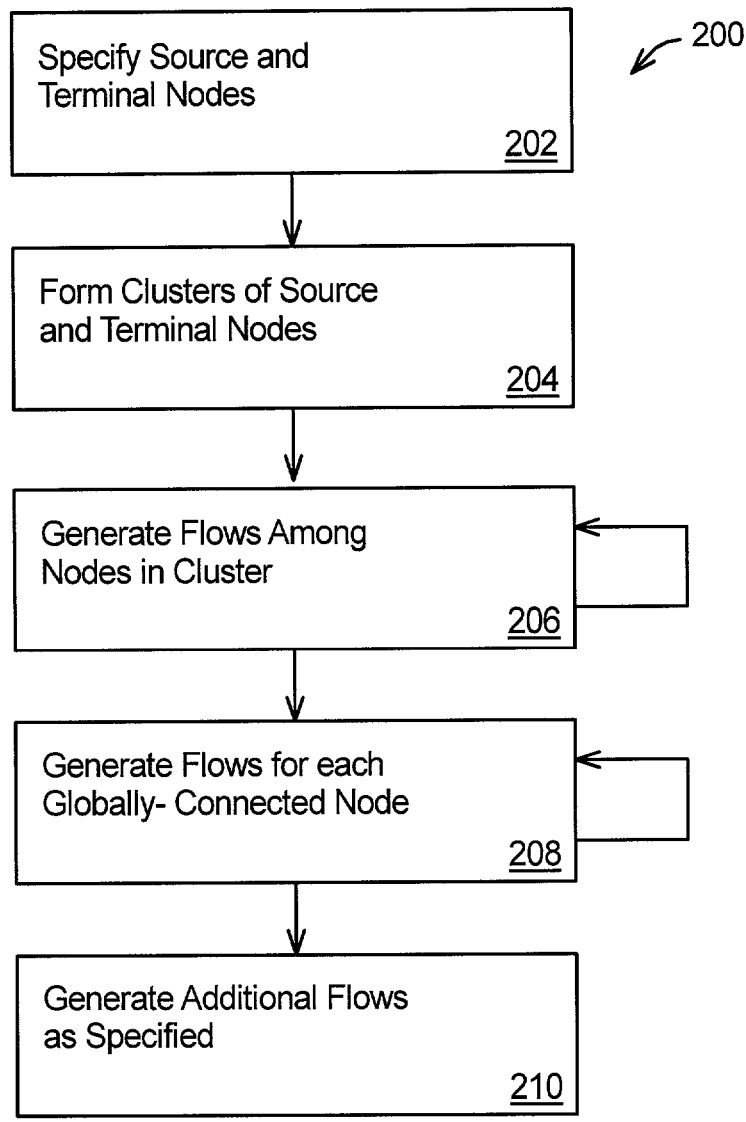
FIG. 8 shows a method for forming an interconnect fabric design problem having clusters and/or globally connected nodes in accordance with an aspect of the present invention.

In accordance with another aspect of the present invention, an interconnect fabric design problem may be formed having clusters of nodes. A cluster of nodes is a set of nodes which primarily or solely communicate with each other. In addition, an interconnect fabric design problem may be formed having globally connected nodes. A globally-connected node is one that communicates with nodes of more that one cluster. FIG. 8 shows a method 200 for forming an interconnect fabric design problem having clusters and/or globally connected nodes in accordance with an aspect of the present invention.

In step 202, source and terminal nodes for an interconnect fabric design problem may be specified. Then, in step 204, the source and terminal nodes may be grouped according to clusters. In addition, nodes that are to be globally-connected may be identified.

Figure 9:
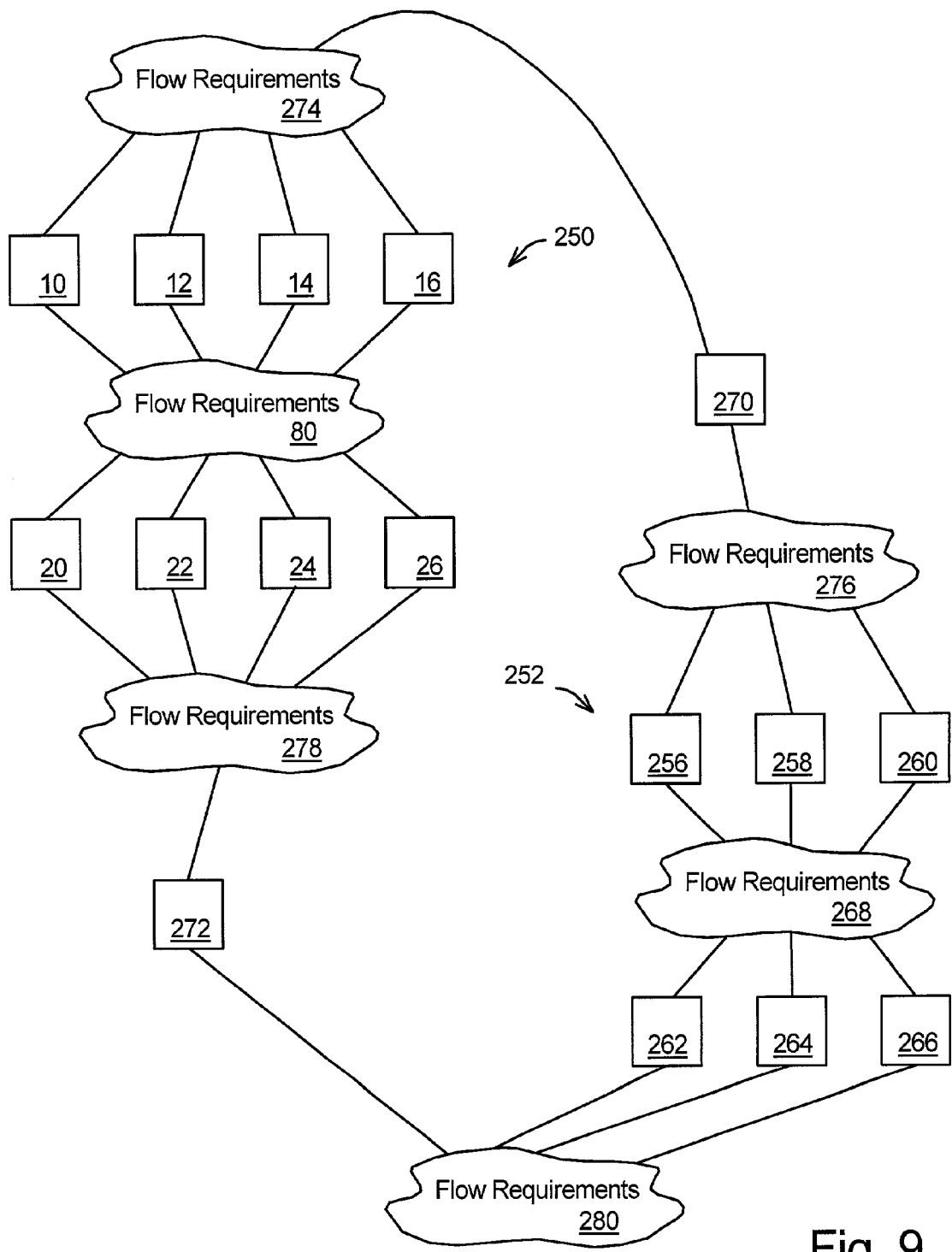
FIG. 9 shows an exemplary design problem that may be formed by the method of FIG. 8.

FIG. 9 shows an exemplary design problem that may be formed by the method of FIG. 8. As shown in FIG. 9, the set of nodes 10-16, 20-26 of FIG. 6 form a first cluster 250 of nodes in FIG. 9. The set of flow requirements 80 specify flow requirements among the nodes of the cluster 250. A second cluster 252 includes a set of nodes, including source nodes 256-260 and terminal nodes 262-266. A set of flow requirements 268 specify requirements for flows among the nodes of the cluster 252.

The example of FIG. 9 also includes globally-connected nodes 270 and 272. In this example, the globally-connected node 270 may be a terminal node. Accordingly, a set of flow requirements 274 may specify flow requirements between the globally-connected node 270 and the source nodes of the cluster 250, while a set of flow requirements 276 may specify flow requirements between the globally-connected node 270 and the cluster 252. Also in this example, the globally-connected node 272 may be a source node. Accordingly, a set of flow requirements 278 between the globally-connected node 272 may specify flow requirements between the terminal nodes of the cluster 250, while a set of flow requirements 280 may specify flow requirements between globally-connected node 272 and the terminal nodes of the cluster 252. It will be apparent, however, that a globally-connected node may act as both a source node and a terminal node and, thus, flow requirements may be provided between a globally-connected node and other nodes, including both source and terminal nodes.

Returning to FIG. 8, in step 206, one of the clusters formed in step 204 may be selected in order to form the flow requirements among the nodes of the cluster. For generating these flows among the nodes of the cluster in step 206, the steps 104-114 of method 100 may be utilized.

In one embodiment, pairs of a source node and a terminal node may be selected in steps 104-106 according to a sequence in which a first source node of the cluster is selected and, then, flows, if any, are formed between the selected source node and the terminal nodes of the cluster in accordance with steps 108-114. Then, a next source node is selected in sequence and flows, if any, are formed between that source node and the terminal nodes of the cluster. Once all of the source nodes of the cluster have been selected and appropriate flows formed, then the terminal nodes of the cluster may be selected in sequence. While forming flows for terminal nodes, a sufficient number of flows for a terminal node may be found to have already been formed while forming flows for the source nodes. In which case, such a terminal node may be skipped.

In the example, a first pass through the step 206 may result in generation of the flow requirements 80 among the nodes of the cluster 250, as explained above in reference to the method 100 of FIG. 1. In a next pass through the step 206, the flow requirements 268 may be generated among the nodes of the cluster 252, also by using the method 100. The step 206 may be repeated until flow requirements have been generated for each cluster of the design problem.

In a step 208, flows may be generated for each globally-connected element. The method 100 may be used in step 208 for generating these flows. In one embodiment, the flow requirements may be specified to include flows between a globally-connected element and only some of the other source nodes and/or terminal nodes in the design problem. Thus, if the globally-connected node is a source node, then a terminal node for a flow to be added may be selected in step 106. The terminal node may be a specified one of the existing nodes in the design problem or may be identified randomly from among the existing nodes. Similarly, if the globally-connected node is a terminal node, a source node for the flow to be added may be selected in step 104.

In other embodiments, however, the design problem may be specified to include at least one flow between a globally-connected element and each source node and/or each terminal node in the design problem. Thus, in the example, the flow requirements 274 and 276 for the globally-connected node 270 may include a flow between the globally-connected node 270 and each of the source nodes 10-16 and 256-260. Thus, for each pass through the method 100 of FIG. 1, the source nodes 10-16 and 256-260 may be selected in step 208 according to a sequence until at least one flow has been formed between each source node 10-16 and 256-260 and the globally-connected element 270.

In a next pass through the step 208, flow requirements 278 and 280 may be generated for the globally-connected node 272. For example, for each pass through the method 100 in step 208 for the globally-connected node 272, the terminal nodes 20-26 and 262-266 may be selected in step 208 according to a sequence until at least one flow has been formed between each terminal node 20-26 and 262-266 and the globally-connected element 272. Thus, the step 208 may be repeated for each globally-connected element in the design problem.

Where a globally-connected node communicates with a significant number of other nodes in the design problem, it may be desired to generate its flows prior to generating flows within the clusters to ensure that the nodes within the clusters will have sufficient capacities to accept the flows for globally-connected devices. Accordingly, the sequence of steps of the method 200 may be altered, depending upon the circumstances.

In step 210, additional flows may be added to the design problem. In one embodiment, flows may be added to each cluster in a pseudo-random fashion. By pseudo-random, what is meant is that computer-generated numbers may follow an apparently random pattern based on a seed value that controls a probability distribution of the generated numbers. For example, a minimum number of flows per node or per cluster may be specified and a maximum number of flows may be specified. Flows may be added such that the total randomly falls somewhere between the maximum and minimum numbers. Further, flows may be added between clusters. For example, a specified minimum and maximum number of source nodes in the design problem may have flows connected to a terminal node of another cluster.

Flows may be added in step 210 so that the number of flows in the resulting design problem falls somewhere between the minimum and maximum numbers. A specified probability and random number generator may be used to determine exactly how many flows are added. If the specified probability is low, then the number of flows in resulting design problem will be near the minimum, whereas, if the specified probability is high, then the number of flows in the resulting design problem will be near the maximum. Thus, the probability will generally control the density of flows (i.e. the number of flows per cluster).

The possible range of numbers of flows in the resulting design problem that are added in step 210 can be controlled by selecting the minimum and maximum numbers of flows. If there is wide difference, then the number of flows in the resulting design problem will be more variable, meaning that over a large number of repetitions of the method, the variability in the number of flows assigned would be higher. If there is narrow difference, then the number of flows in the resulting design problem will be less variable. In one embodiment, the minimum and maximum numbers may be set to the same level.

For example, for each cluster, a maximum number of additional flows that may be added to a cluster may be computed as a difference between a specified maximum number of flows for the cluster and the number of flows already in the cluster. More particularly, a maximum number of flows per source node (or per terminal node) in the cluster may be specified. This number may then be multiplied by the number of source nodes (or terminal nodes) in the cluster to determine the maximum number of flows for the cluster. Then, the number of existing flows in the cluster (as a result of adding flows in steps 206 and 208) may be subtracted from the product to determine the maximum number that may be added in step 210.

If the maximum number of flows that may be added is zero, then no additional flows are added in step 210. However, if the result is one or more, then the method 100 of FIG. 1 may be used to add flows to the cluster. In one embodiment, a probability for keeping such additional flows may be specified. Thus, after flow is generated by the method 100, the flow may be discarded in step 210 according to the probability. For example, assume that the maximum number of flows that may be added is three and the specified probability is seventy percent (70%). In which case, the method 100 is performed three times. For each flow formed by the method 100, the specified probability of seventy percent is applied to the flow determine whether to keep or discard the flow (e.g., the probability of keeping any one of the flows is 70%). It will be apparent that other techniques may be utilized for adding additional flows to the design problem.

Figure 10:
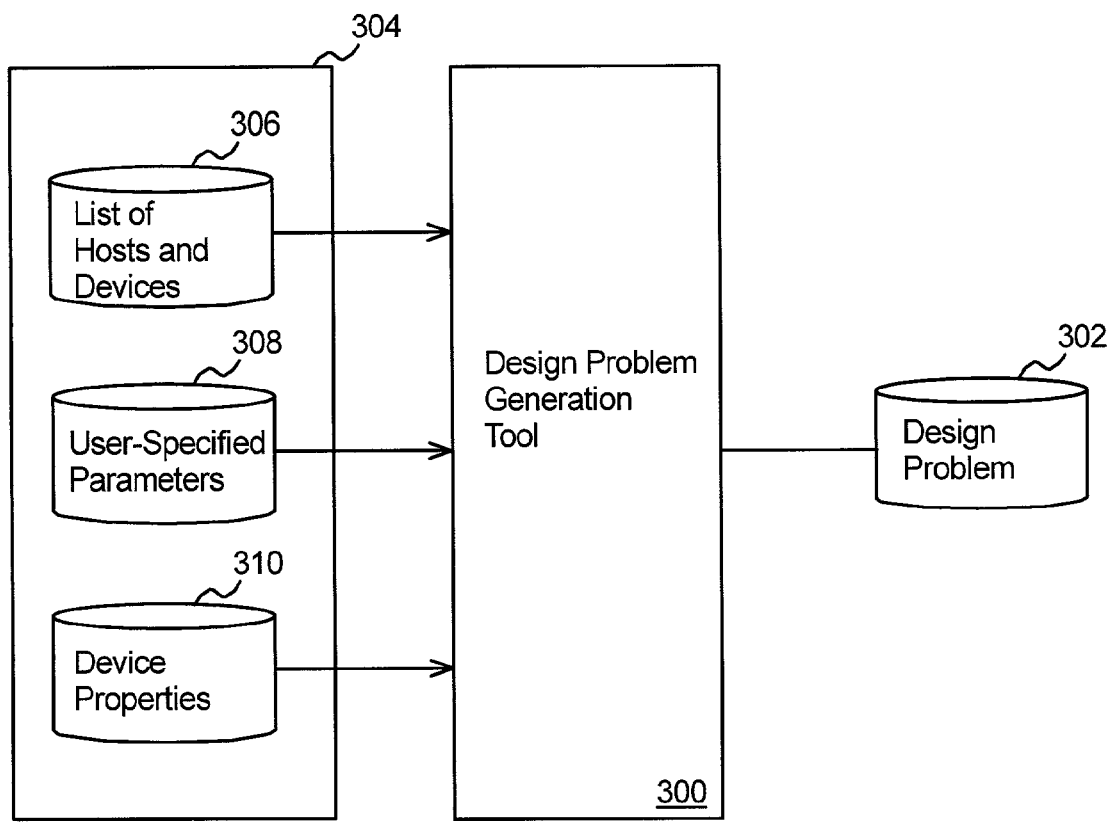
FIG. 10 shows a system having a fabric design problem generation tool that may be used to generate an interconnect fabric design problem in accordance with an aspect of the present invention.

FIG. 10 shows a system having a fabric design problem generation tool 300 that may employ the method 100 (and the method 200) to generate a interconnect fabric design problem 302. The fabric design problem generation tool 300 may be implemented in computer software and/or hardware to perform its functions. Design information 304 in one embodiment includes a list of hosts (source nodes) and devices (terminal nodes) 306, a set of user-specified parameters 308, and a set of device properties 310. The design information 304 may be implemented as an information store, such as a file or set of files or a database, etc.

The list of hosts and devices 306 may specify the source nodes and terminal nodes which are to be interconnected by flow requirements of the interconnect fabric design problem 302. This list may also identify source and terminal nodes that are to be globally-connected. This list 306 may be specified by a user and may be obtained in step 102 of FIG. 1 and/or step 202 of FIG. 8.

The set of user-specified parameters 308 may include, for example, a number of clusters to be formed (e.g., in step 204 of FIG. 8), a minimum number of flows for each cluster, each source node, each terminal node, and/or each globally-connected node (e.g., used in steps 206, 208 and 210 of FIG. 8), a maximum number of flows for each cluster, each source node, each terminal node and/or each globally-connected node (e.g., used in step 210 of FIG. 8), and a probability that a particular flow will be retained or discarded (e.g., used in step 210 of FIG. 8).

The user specified parameters 308 may also specify a desired level of port saturation. For example, determining capacity available at a node, as in steps 108 or 110, may depend on port saturation at the node and on unused capacity at each port of the node. Also, a user may specify a percentage of port capacities that may be used. In the examples above, the maximum bandwidth capacity of a port (e.g., port 38 of source node 12) was assumed to be 100 Mb/s. This capacity was then used to determine that maximum bandwidth of a flow that was feasible to add to the flow requirements. In this case, the percentage of port capacity that may be used may be assumed to be one hundred percent (100%). In other embodiments, a different percentage of port capacity may be specified for use. If the specified percentage was assumed to be 80%, in the example, then a flow would be feasible to add to the flow requirements only if the resulting flow requirements for that port remained less than or equal to 80 Mb/s.

The user-specified parameters 308 may further include a seed for a random number generator. For example, the random number generator may be implemented by the generation tool 300 to randomly select nodes between which a flow is to be added to the requirements (e.g., step 104 or 106 of FIG. 1), to determine whether to retain or discard additional flows (e.g., step 210 of FIG. 8), to select a bandwidth for a flow between upper and lower bounds (e.g., step 210 of FIG. 8), and so forth.

The device properties data 310 may specify, for example, a bandwidth capacity of each source node and terminal node, a number of ports for each and the bandwidth capacities of the ports.

Design problem 302 generated by the interconnect problem generation tool 300 may include the flow requirements generated in accordance with the present invention.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A computer implemented method for generating an interconnected fabric design problem specification, the problem specification including requirements for a plurality of flows among a set of network nodes and the problem specification suitable for application of a design technique by which physical communication links and communication devices are arranged to meet the flow requirements, the method comprising:

selecting, from among the set of network nodes, a source node and terminal node for a flow to be added to the requirements;

determining a maximum capacity available at the selected source node;

determining a maximum capacity available at the selected terminal node;

determining which of the maximum capacity available at the selected source node and the maximum capacity available at the selected terminal node is smaller;

setting a maximum capacity requirement for a flow between the selected source node and the selected terminal node to a value less than or equal to the determined smaller maximum capacity; and generating the flow between the selected source node and the selected terminal node.

2. The method according to claim 1, wherein determining the maximum capacity available at the selected source node comprises determining a capacity available at each port of the source node and selecting the highest available capacity for the source node ports, and wherein determining the maximum capacity available at the selected terminal node comprises determining a capacity available at each port of the terminal node and selecting the highest available capacity for the terminal node ports.

3. The method according to claim 2, wherein determining the capacity at each port of the source or terminal node depends on a specified degree of port saturation and unused port capacity.

4. The method according to claim 1, wherein said selecting, said determining and said generating is repeated until a stop condition is reached.

5. The method according to claim 4, wherein the stop condition is reached when each node in the set has at least a specified number of flows.

6. The method according to claim 1, wherein said set of network nodes comprises a cluster of nodes and wherein the design problem specification includes a plurality of clusters.

7. The method according to claim 6, wherein the design problem specification includes at least one flow between a pair of clusters.

8. The method according to claim 7, wherein the design problem specification further comprises at least one node not in the clusters having a flow to a node in the clusters.

9. The method according to claim 1, further comprising generating an additional flow and determining whether to add the additional flow to the design problem specification according to a specified probability.

10. The method according to claim 9, further comprising repeating said steps of generating an additional flow and determining whether to add the additional flow to the design problem specification a number of times determined from a difference between a current number of flows and a specified maximum number of flows.

11. The method according to claim 1, wherein the flow is assigned to a single port at each of the source node and the terminal node.

12. The method according to claim 1, wherein the flow is split among multiple ports at one or both of the source node and the terminal node.

13. A system for generating an interconnect fabric design problem specification for communication among a set of nodes, the system comprising:

a set of design information including user-specified parameters for the design problem specification; and a fabric design problem generation tool that generates the design problem specification for the interconnect fabric by adding flows to a set of flow requirements among the set of nodes in response to the design information, wherein said fabric design problem generation tool is to:
  select, from among the set of network nodes, a source node and a terminal node for a flow to be added to the flow requirements,
  determine a maximum capacity available at the selected source node,
  determine a maximum capacity available at the selected terminal node,
  determine which of the maximum capacity available at the selected source node and the maximum capacity available at the selected terminal node is smaller,
  set a maximum capacity requirement for a flow between the selected source node and the selected terminal node to a value less than or equal to the determined smaller maximum capacity, and
  generate the flow between the source node and the terminal node.

14. The system according to claim 13, wherein said fabric design problem generation tool determines the maximum capacity available at the source node by determining a capacity available at each port of the source node and selecting the highest available capacity for the source node ports and wherein said fabric design tool determines the maximum capacity available at the terminal node by determining a capacity available at each port of the terminal node and selecting the highest available capacity for the terminal node ports.

15. The system according to claim 14, wherein said fabric design problem generation tool determines the capacity at each port of the source or terminal node based on a specified degree of port saturation and unused port capacity.

16. The system according to claim 13, wherein said fabric design problem generation tool adds flows to the set of flow requirements until a stop condition is reached.

17. The system according to claim 16, wherein the stop condition is reached when each node in the set has at least a specified number of flows.

18. The system according to claim 16, wherein the stop condition is based on bandwidth levels of the flow requirements.

19. The system according to claim 13, wherein said set of network nodes comprises a cluster of nodes and wherein the design problem includes a plurality of clusters.

20. The system according to claim 19, wherein the design problem specification includes at least one flow between a pair of the clusters.

21. The system according to claim 20, wherein the design problem specification further comprises at least one node not in the clusters having a flow to a node in the clusters.

22. The system according to claim 13, wherein the fabric design problem generation tool generates an additional flow and determines whether to add the additional flow to the design problem according to a specified probability.

23. The system according to claim 22, wherein the fabric design problem generation tool repeatedly generates an additional flow and determines whether to add the additional flow to the design problem a number of times determined from a difference between a current number of flows and a specified maximum number of flows.

24. The method according to claim 1, wherein the maximum capacity requirement for the generated flow is randomly selected to be a value less than or equal to the lower of the maximum capacity of the source node and the terminal node.

25. The method according to claim 1 wherein the capacity available at a node is reduced by the capacity of each flow assigned to the node.

26. The system according to claim 13, wherein the maximum capacity requirement for the generated flow is randomly selected to be a value less than or equal to the lower of the maximum capacity of the source node and the terminal node.

27. The system according to claim 13 wherein the capacity available at a node is reduced by the capacity of each flow assigned to the node.

* * * * *